United States Patent
Tseng et al.

(10) Patent No.: US 7,378,994 B1
(45) Date of Patent: May 27, 2008

(54) EFM/EFM+ ENCODER AND METHOD THEREOF

(75) Inventors: Wei-Hsiang Tseng, Taipei (TW);
Shih-Ta Hung, Taoyuan County (TW);
Hsin-Cheng Chen, Tainan County (TW)

(73) Assignee: Mediatek, Inc., Hsinchu (TW)

( * ) Notice: Subject to any disclaimer, the term of this patent is extended or adjusted under 35 U.S.C. 154(b) by 0 days.

(21) Appl. No.: 11/620,764

(22) Filed: Jan. 8, 2007

(51) Int. Cl.
*H03M 5/00* (2006.01)

(52) U.S. Cl. .................. 341/59; 360/41; 369/59.23

(58) Field of Classification Search .......... 341/58, 341/59; 360/40, 41, 48; 369/59.23
See application file for complete search history.

(56) References Cited

U.S. PATENT DOCUMENTS

| | | | |
|---|---|---|---|
| 5,696,505 A | * | 12/1997 | Schouhamer Immink .... 341/59 |
| 5,790,056 A | * | 8/1998 | Schouhamer Immink .... 341/58 |
| 5,828,754 A | | 10/1998 | Hogan |
| 6,778,104 B2 | | 8/2004 | Chen et al. |
| 7,009,532 B2 | * | 3/2006 | Ushiyama et al. ............ 341/59 |
| 2007/0229327 A1 | * | 10/2007 | Chen et al. .................... 341/59 |

FOREIGN PATENT DOCUMENTS

| | | | |
|---|---|---|---|
| JP | 04339365 A | * | 11/1992 |
| JP | 11177430 A | * | 7/1999 |

* cited by examiner

*Primary Examiner*—Howard Williams
(74) *Attorney, Agent, or Firm*—Thomas, Kayden, Horstemeyer & Risley (57) ABSTRACT

An EFM/EFM+ encoder and a method thereof, performing digital sum value (DSV) protection in an Eight-to-Fourteen/Eight-to-Fourteen Plus (EFM/EFM+) encoding system to generate a data frame to be recorded on a recording medium. The method comprises modulating source data to the data frame having a predetermined number of channel bits, determining merging bits and DSV based on the channel bits, and changing the predetermined number of the channel bits in the data frame based on the DSV and the merging bits. The changing the predetermined number of the channel bits comprises inserting or removing a channel bit at the end of the data frame.

22 Claims, 12 Drawing Sheets

| Data symbol | | 0x9a | | Merging bits |
|---|---|---|---|---|
| EFM | 1 0 0 1 0 0 0 0 0 0 0 0 1 | | 0 0 0 |

Channel bit  0 0 0 1 1 1 1 1 1 1 1 1 0 0 0 0

State value  -1 -1 -1 1 1 1 1 1 1 1 1 1 -1 -1 -1 -1

DSV  -1 -2 -3 -2 -1 0 1 2 3 4 5 6 7 6 5 4 3

FIG. 1a ( PRIOR ART )

| FIG. 1a (PRIOR ART) | FIG. 1b (PRIOR ART) |
|---|---|

0xb9　　　　　　　　　　Merging　　　0x9a
　　　　　　　　　　　　 bits 1 0 0 0 0 0 0 0 1 0 0 1 | 0 0 0 | 1 0 0 1 0 0 0 0 0 0 0 1 ...

| synchronization pattern | sub-channel data | main channel data | CIRC code | main channel data | CIRC code |
|---|---|---|---|---|---|
| (24+3)bits | (14+3)bits | (12×(14+3))bits | (4×(14+3))bits | (12×(14+3))bits | (4×(14+3))bits |
| 300 | 302 | 304 | 306 | 308 | 310 |

588 bits

EFM/EFM+ ENCODER AND METHOD THEREOF

BACKGROUND OF THE INVENTION

1. Field of the Invention

The invention relates to EFM/EFM+ encoding, and in particular to a EFM/EFM+ encoder and a method thereof.

2. Description of the Related Art

In optical disc recording, data is transferred thereto in 8-bit form, known as a data symbol. The disc system then generates header and synchronization information, control bytes, identification data, and copyright management information, processes data including data scrambling and error correction code generation on the data symbols, and modulates the data symbols using EFM (Eight-to-Fourteen Modulation) for CD and EFM+ (Eight-to-Fourteen Modulation Plus) for DVD to produce modulated bits and channel bits for recoding.

Channel bits are typically transmitted in a Non Return to Zero Inverted (NRZI) format, comprising two possible states at one of which the channel bit remains until a binary one occurs in the modulated bits, i.e., each channel bit may either at +1 or −1 state. A channel bit is the minimum recording unit T on CDs and DVDs, referred to as Run-length Limited (RLL) code, meaning the number of consecutive binary zeros in the encoded bit pattern must be at least as large as a specified non-zero minimum and not exceeding a specified maximum. For example, CDs typically employ a code specified as 3-11T RLL, meaning the number of consecutive zeros in the encoded bit pattern must be at least 2 and not exceeding 10.

In a multimedia playback system, a data slicer typically deploys the DC value of the channel bits as the reference to determine the states of NRZI format channel bits. Since each channel bit is either in +1 or −1 state, it is crucial to ensure the DC value of the channel bits is close to 0, or a DC-free value, to determine each channel bit accurately. A sum of the state of consecutive channel bits is referred to as A Digital Sum Value (DSV), indicating the DC value of the channel bit. Any DSV exceeding the specified maximum is likely to cause data read errors or problems in reading data on CDs and DVDs.

In EFM encoding for CDs, an EFM encoder takes each 8-bit data symbol as an index into a conversion table of channel bit patterns to converts to 14-bit channel bit sequence. The modulated 14-bit channel bits are referred to as a codeword. Each codeword satisfies the 3-11T RLL constraint. A 3-bit merging bit is determined to join two consecutive codewords so that the concatenated channel bits sequence may not violate the 3-11T RLL constraint. With appropriate merging bits the resulting channel bit sequence can meet both 3-11T RLL and DSV requirements. However, inappropriate choice of merging bits results in large DSV, leading to inaccurate data reading.

Figure 1A:
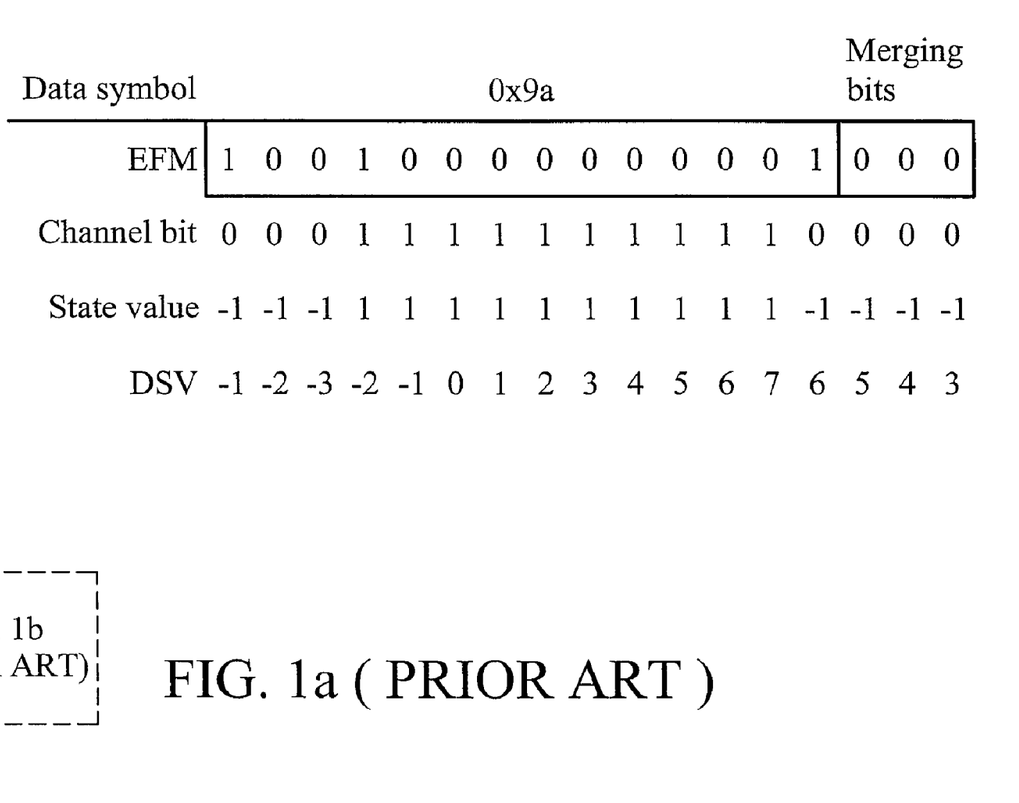
FIGS. 1a and b show an example of a conventional channel bit sequence that produces divergent DSV.
Figure 1B:
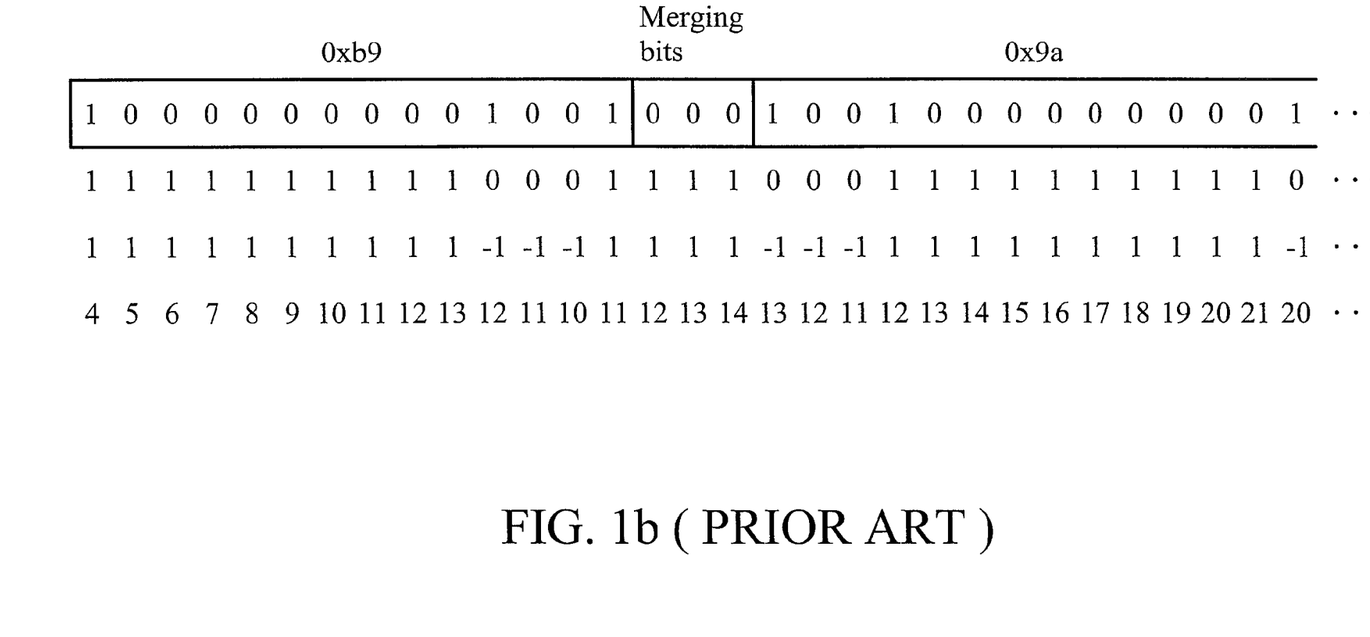

FIGS. 1a and b show an example of a conventional channel bit sequence that produces divergent DSV. When EFM is used to modulate a special data pattern of {0x9a, 0xb9, 0x9a, 0xb9, 0x9a, 0xb9 . . . } (hexadecimal form), it is noted that the absolute value of DSV generated from the channel bits after modulation will cumulatively increase and cannot be controlled via the standard EFM modulation. If the value of DSV cannot be kept small, the excessively large DSV of the recorded data results in the data slicer, conventionally used to retrieve the binary signal from the analog signal detected on optical discs, being unable to function correctly, and the data readout from the disc is erroneous. Moreover, the large DSV variance implies that the EFM signal is no longer DC-free, and the low-frequency components of the EFM signal interfere with the related servo control signal of the optical disc system.

Thus a need exists for an EFM/EFM+ encoder and method of inhibiting copying unauthorized data on an optical recording medium.

BRIEF SUMMARY OF THE INVENTION

A detailed description is given in the following embodiments with reference to the accompanying drawings.

According to the invention, a method of performing digital sum value (DSV) protection in an Eight-to-Fourteen/Eight-to-Fourteen Plus (EFM/EFM+) encoding system to generate a data frame to be recorded on a recording medium is disclosed. The method comprises modulating source data to the data frame having a predetermined number of channel bits, determining merging bits and DSV based on the channel bits, and changing the predetermined number of the channel bits in the data frame based on the DSV and the merging bits.

Another method of performing digital sum value (DSV) protection in an Eight-to-Fourteen/Eight-to-Fourteen Plus (EFM/EFM+) encoding system is provided. The method comprises modulating source data to channel bits, determining first merging bits and DSV based on the channel bits, and changing the source data based on the DSV and the first merging bits, thereby determining second merging bits. The changed source data can be recovered via error correction code decoding.

Further provided is an Eight-to-Fourteen/Eight-to-Fourteen Plus (EFM/EFM+) encoder, performing digital sum value (DSV) protection to generate a data frame to be recorded on a recording medium, comprising a modulator, merging bits and DSV generator, and a merging bit adaptor. The modulator modulates source data to the data frame having a predetermined number of channel bits. The merging bits and DSV generator, coupled to the modulator, determine merging bits and DSV based on the channel bits. The merging bit adaptor, coupled to the merging bits and DSV generator, changes the predetermined number of the channel bits in the data frame based on the DSV and the merging bits.

Another Eight-to-Fourteen/Eight-to-Fourteen Plus (EFM/EFM+) encoder is provided, performing digital sum value (DSV) protection and comprising a modulator, a merging bits and DSV generator, and a source data adaptor. The modulator modulates source data to channel bits. The merging bits and DSV generator, coupled to the modulator, determines first merging bits and DSV based on the channel bits. The source data adaptor, coupled to the merging bits and DSV generator, changes the source data based on the DSV and the first merging bits, thereby determining second merging bits. The changed source data can be recovered via error correction code decoding.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
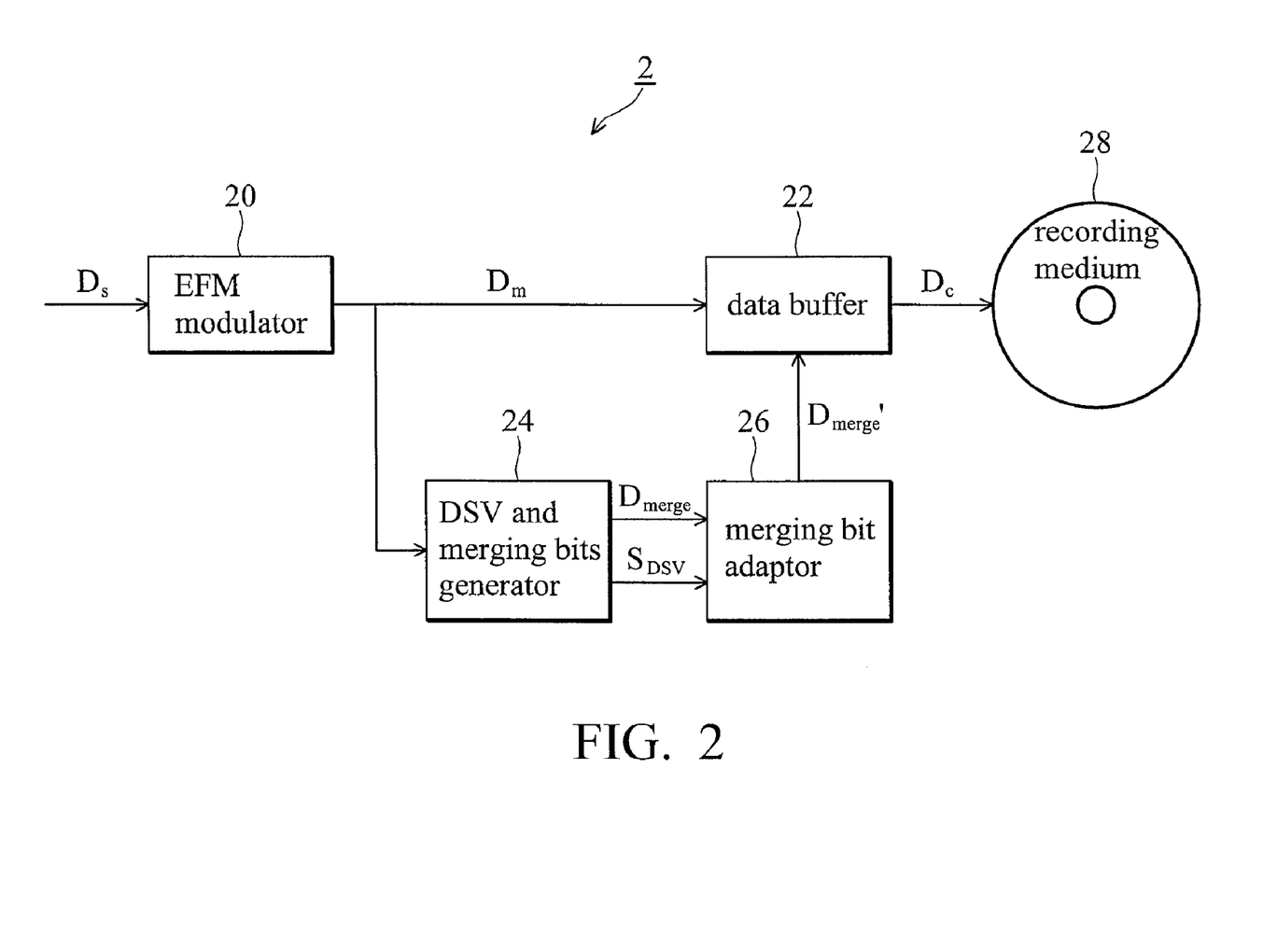
FIG. 2 is a block diagram of an exemplary recording system according to the invention.

FIG. 2 is a block diagram of an exemplary recording system according to the invention, comprising EFM modulator 20, data buffer 22, DSV and merging bits generator 24, and merging bit adaptor 26. EFM modulator 20 is coupled to data buffer 22 and DSV and merging bits generator 24, and subsequently to merging bit adaptor 26.

Figure 3:
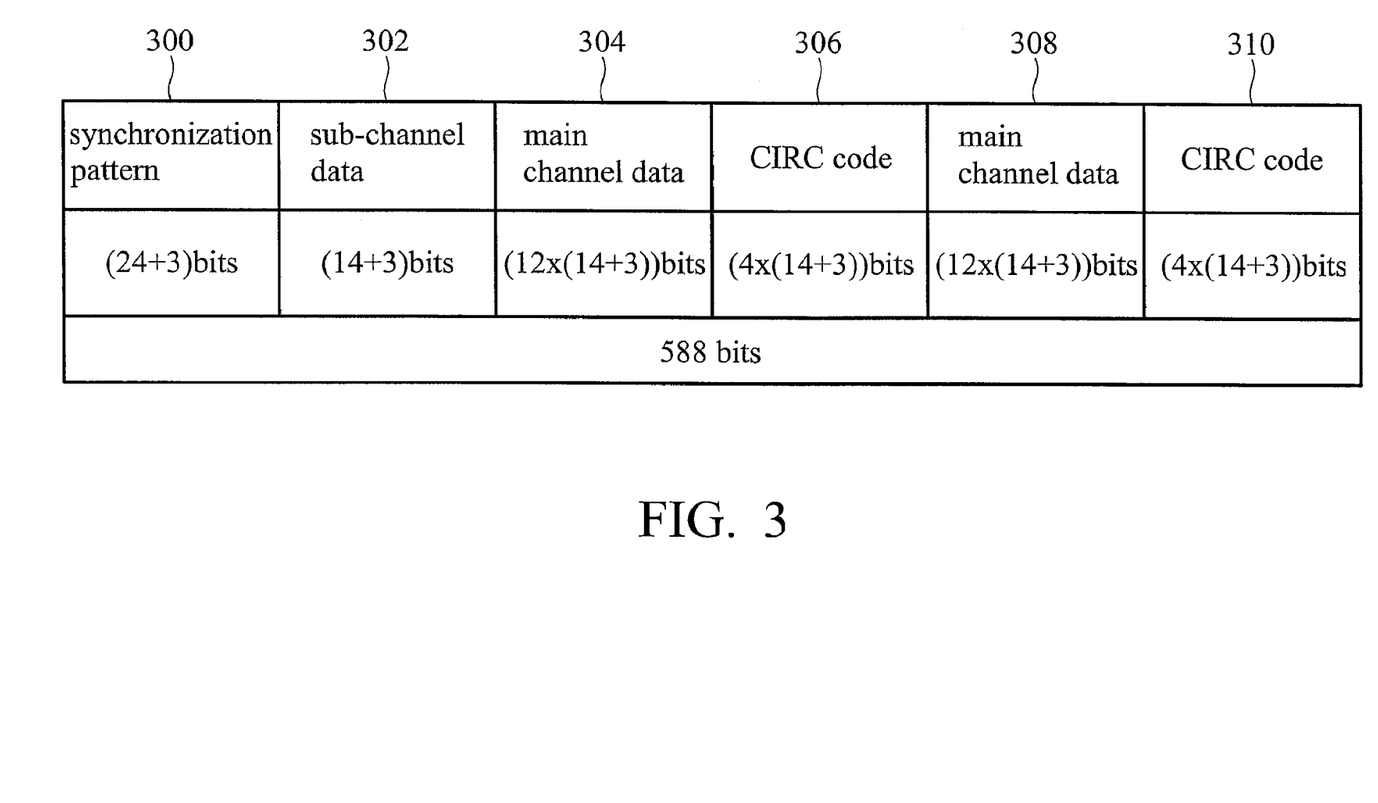
FIG. 3 is a channel frame structure encoded by EFM.

After encoding with Cross-Interleave Reed-Solomon (CIRC) encoder (not shown), data symbols Ds are fed into EFM modulator 20 for EFM channel modulation. EFM modulator 20 modulates each 8-bit data symbol Ds to a corresponding 14-bit channel bit sequence $D_m$, referred to as codeword, according to a symbol conversion table (not shown). In EFM encoding, 24-bit synchronization pattern and predetermined number $N_{CW}$ of modulated channel bit $D_m$ are adjoined to one another by 3-bit merging bits to form a channel frame that comprises predetermined number $N_b$ of channel bits. The 3-bit merging bits are selected to reduce the DSV and meet the 3~11 channel bits requirement of the run-length limit. FIG. 3 is a channel frame structure encoded by EFM, comprising synchronization pattern 300, sub channel data 302, main channel data 304, CIRC code 306, main channel data 308, and CIRC code 310. Synchronization pattern 300 is unique (e.g., '100000000001000000000010') in recording medium 28, serving to identify a frame start in the channel frame. Upon identification of the frame start, the successive 33 bytes belong to a single channel frame, i.e., 14-bit synchronization pattern followed by 3 merging bits then 33 bytes constitutes 588 (24+3+(14+3)*33) channel bits in a channel frame.

Referring back to FIG. 2, modulated channel bit $D_m$ are subsequently passed to data buffer 22 for data storage and DSV and merging bits generator 24 for identifying excessive DSV signal $S_{DSV}$ and merging bits $D_{merge}$ according thereto. Merging bit adaptor 26 receives excessive DSV signal $S_{DSV}$ and merging bits $D_{merge}$ to change predetermined number $N_b$ of the channel bits in the channel frame based thereon, and produces adapted merging bits $D_{merge}'$ to data buffer 22. Merging bit adaptor 26 uses excessive DSV signal $S_{DSV}$ and merging bits $D_{merge}$ to determine whether to insert additional merging bits or remove at least one merging bit $D_{merge}$ at the last merging bit of the channel frame, such that digital sum value DSV is reduced.

Figure 4A:
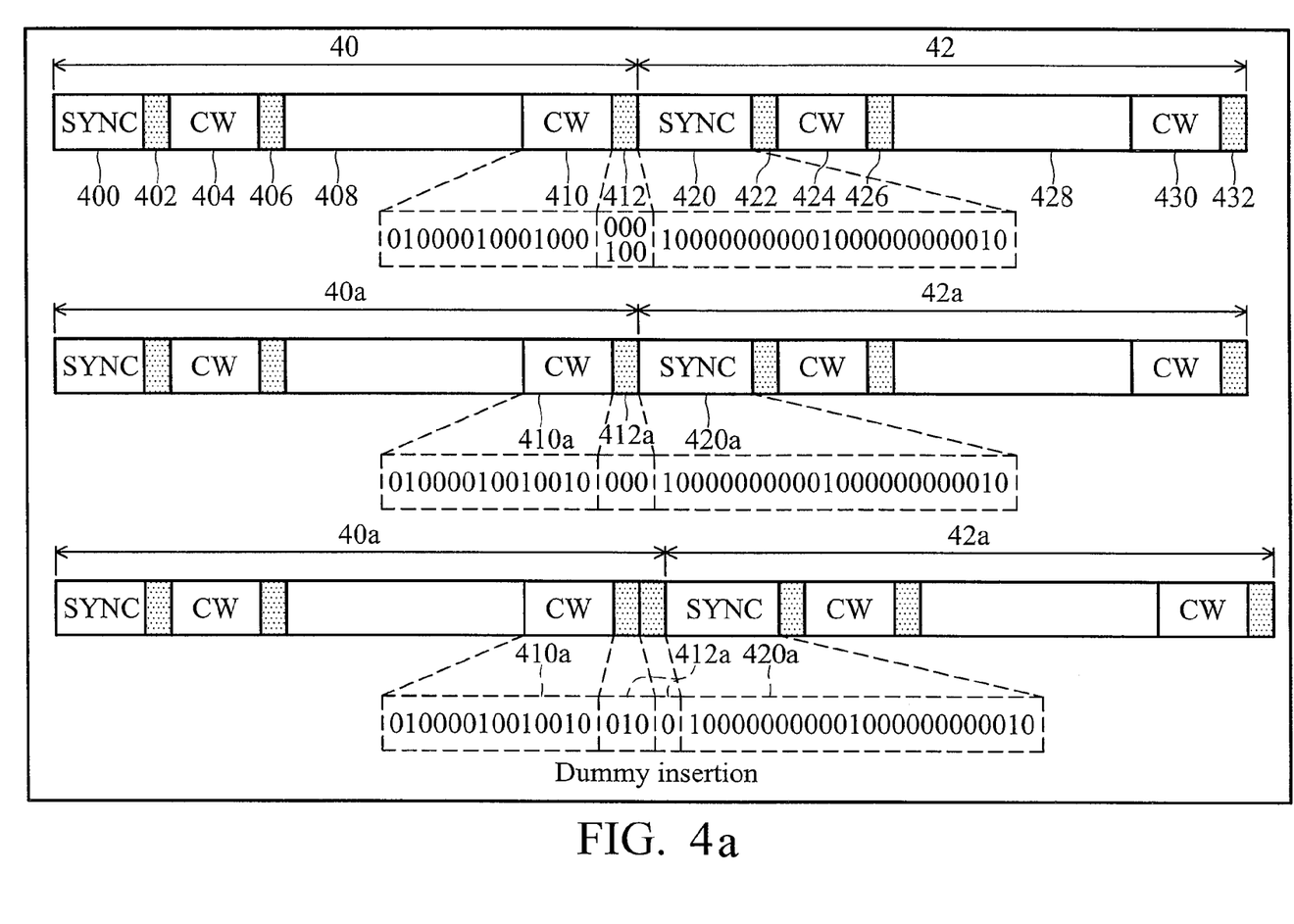
FIGS. 4a, b, and c illustrate exemplary methods of DSV protection in the invention.

FIGS. 4a, b, and c illustrate exemplary methods of DSV protection in the invention, incorporating the recording system in FIG. 2.

Referring to FIG. 4a, because the last codeword 410 is '01000010001000' and synchronization pattern 420 is '100000000001000000000010', DSV and merging bits generator 24 determine merging bits 412 can only be '000' or '100'. If merging bits 412 are '000' (shown as merging bits 412a), merging bits adaptor 26 inserts extra channel bit '1' thereinto such that new merging bits 412a become '0100', providing an extra channel bit transition to provide DSV reduction.

Figure 4B:
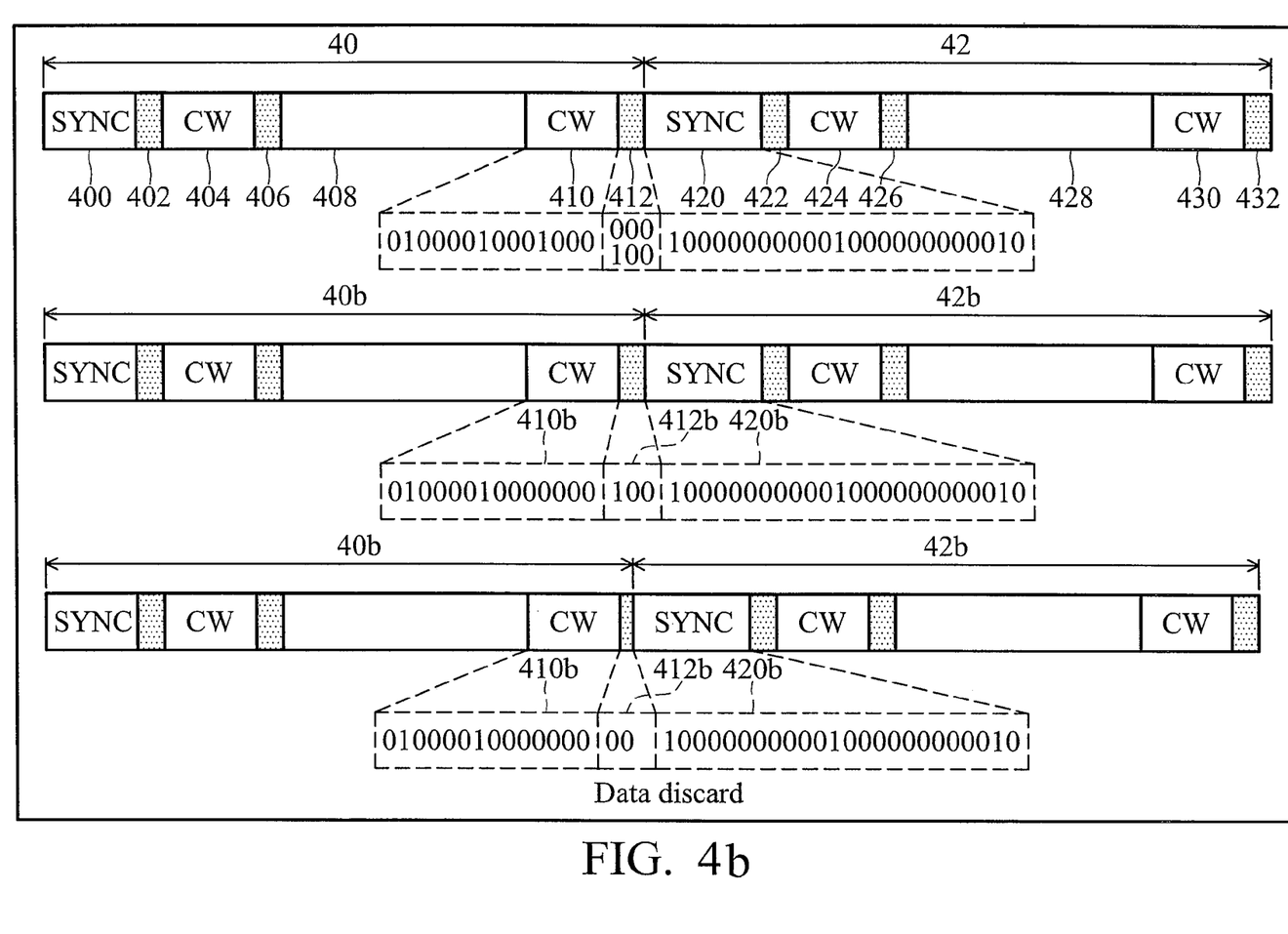

Referring to FIG. 4b, because the last codeword 410 is '01000010000000' and synchronization pattern 420 is '100000000001000000000010', DSV and merging bits generator 24 determine merging bits 412 as '100' (shown as merging bits 412b), merging bits adaptor 26 removes a '1' such that merging bits 412b '00' becomes a viable selection, thereby decreasing digital sum value DSV.

Figure 4C:
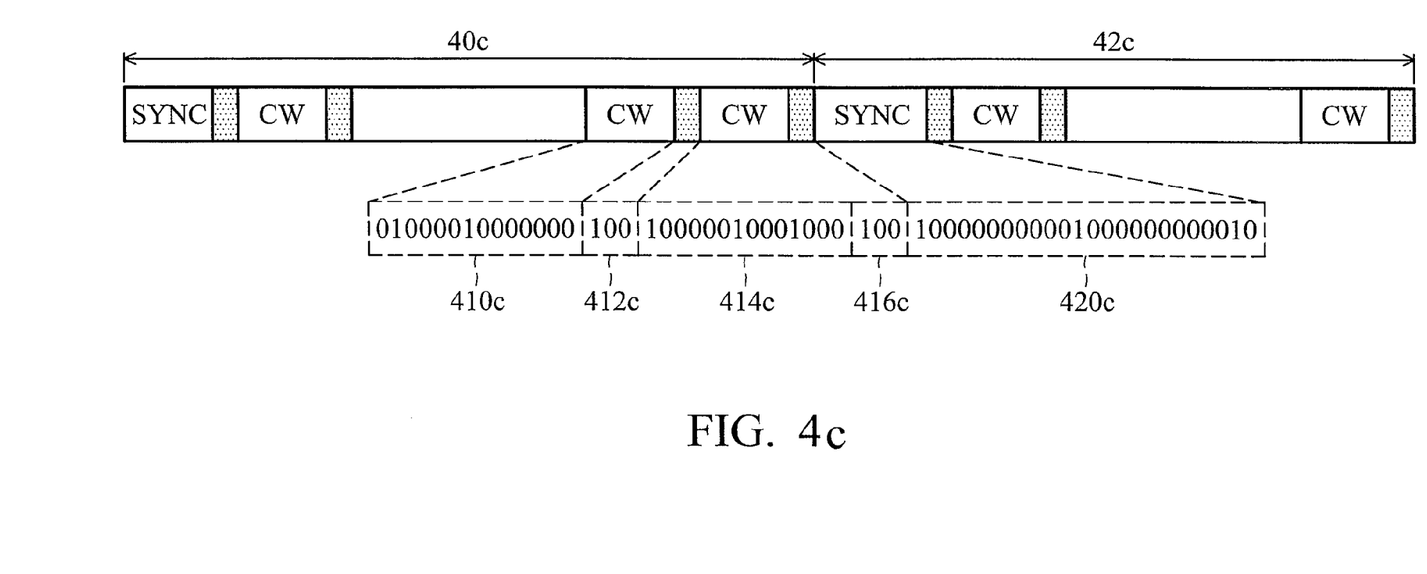

Referring to FIG. 4c, the last codeword 410 is '01000010000000' and synchronization pattern 420 is '100000000001000000000010', DSV and merging bits generator 24 determines merging bits 412 as '100' (shown as merging bits 412c), merging bits adaptor 26 inserts extra codeword 414c '10000010001000' and merging bits 416c '100' so that extra channel bit transitions are added and digital sum value DSV is reduced.

Figure 5:
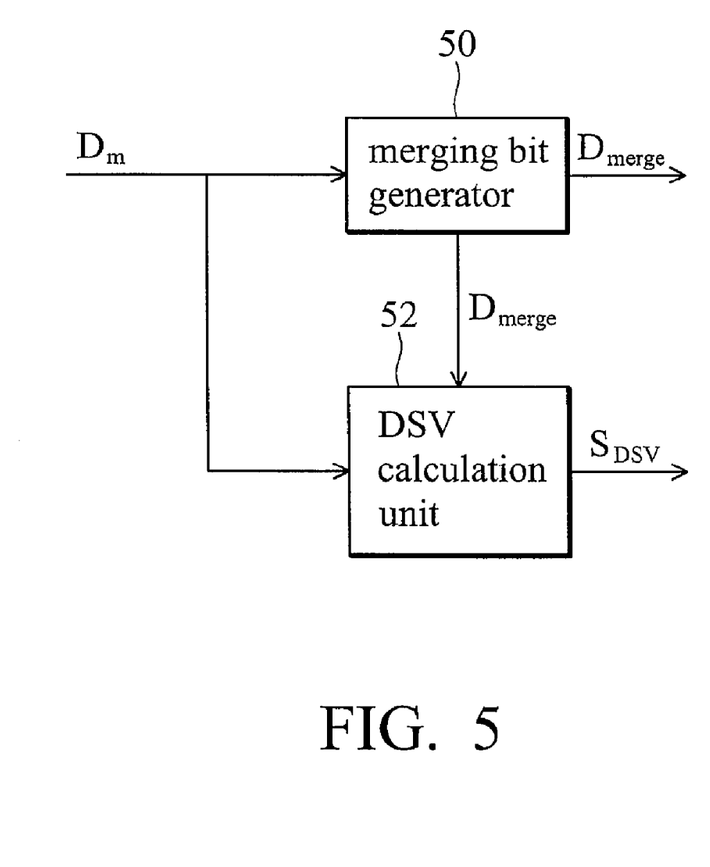
FIG. 5 is a block diagram of the exemplary DSV and merging bit generator 26 in FIG. 2.

FIG. 5 is a block diagram of an exemplary DSV and merging bit generator 26 in FIG. 2, comprising merging bit generator 50 and DSV calculation unit 52. EFM modulator 20 is coupled to merging bit generator 50, and to DSV calculation unit 52 and margining bit adaptor 26.

Merging bit generator 50 selects applicable 3-bit merging bits $D_{merge}$ based on the leading bit pattern of the input channel bit sequence and on the final bit pattern of the immediately preceding channel bit sequence and sequentially outputs merging bits $D_{merge}$ to the DSV calculator unit 52 and margining bit adaptor 26.

Figure 6:
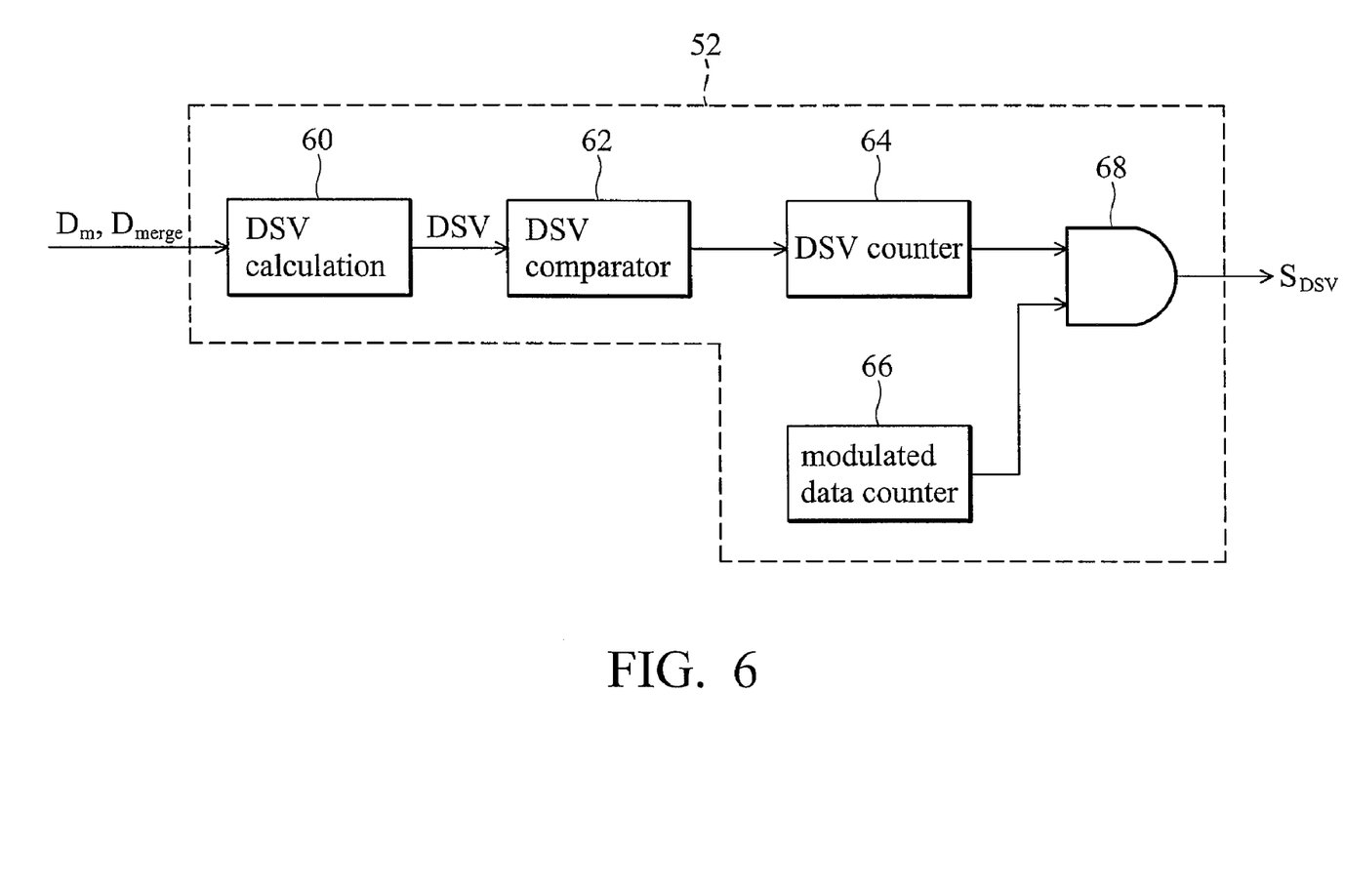
FIG. 6 is a block diagram of an exemplary DSV calculation unit in FIG. 5.

FIG. 6 is a block diagram of an exemplary DSV calculation unit in FIG. 5, comprising DSV calculator 60, DSV comparator 62, DSV counter 64, data counter 66, and AND gate 68. DSV calculator 60 is coupled to DSV comparator 62, DSV counter 64, and in conjunction with data counter 66 coupled to AND gate 68.

DSV calculator 60 receives codeword from EFM modulator 20 and merging bits from merging bits generator 50 to form a modulated bit sequence, and calculates digital sum value DSV based thereon. DSV threshold comparator 62, while considering the tolerance of the data slicer and the range of DSV variation of normal modulated bits, compares digital sum value DSV with predetermined DSV threshold value $DSV_{th}$ to determine whether digital sum value DSV exceeds predetermined DSV threshold value $DSV_{th}$, and outputs DSV excess signal $DSV_{ex}$ if so. In addition, since the data slicer operates with reference to the DC component of the channel bit sequence, it is not necessary to perform DSV protection on the rapid DSV variation. Thus, DSV counter 64 calculates number NDSV of consecutive DSV excess signal $DSV_{ex}$, and generates a logic "1" to AND gate 68 when number NDSV exceeds predetermined DSV count $N_{DSVth}$. Further, since merging bits adaptation only takes place at the end of every channel frame, data counter 66 calculates number $N_{data}$ of data bytes in the channel frame, and produces a logic "1" to AND gate 68 when number $N_{data}$ exceeds predetermined data count $N_{datath}$. Upon receiving logic "1" from both DSV counter 64 and data counter 66, AND gate 68 outputs a logic "1" at excess DSV signal $S_{DSV}$ to merging bits adaptor 26, performing merging bit adaptation to reduce digital sum value DSV.

Figure 7:
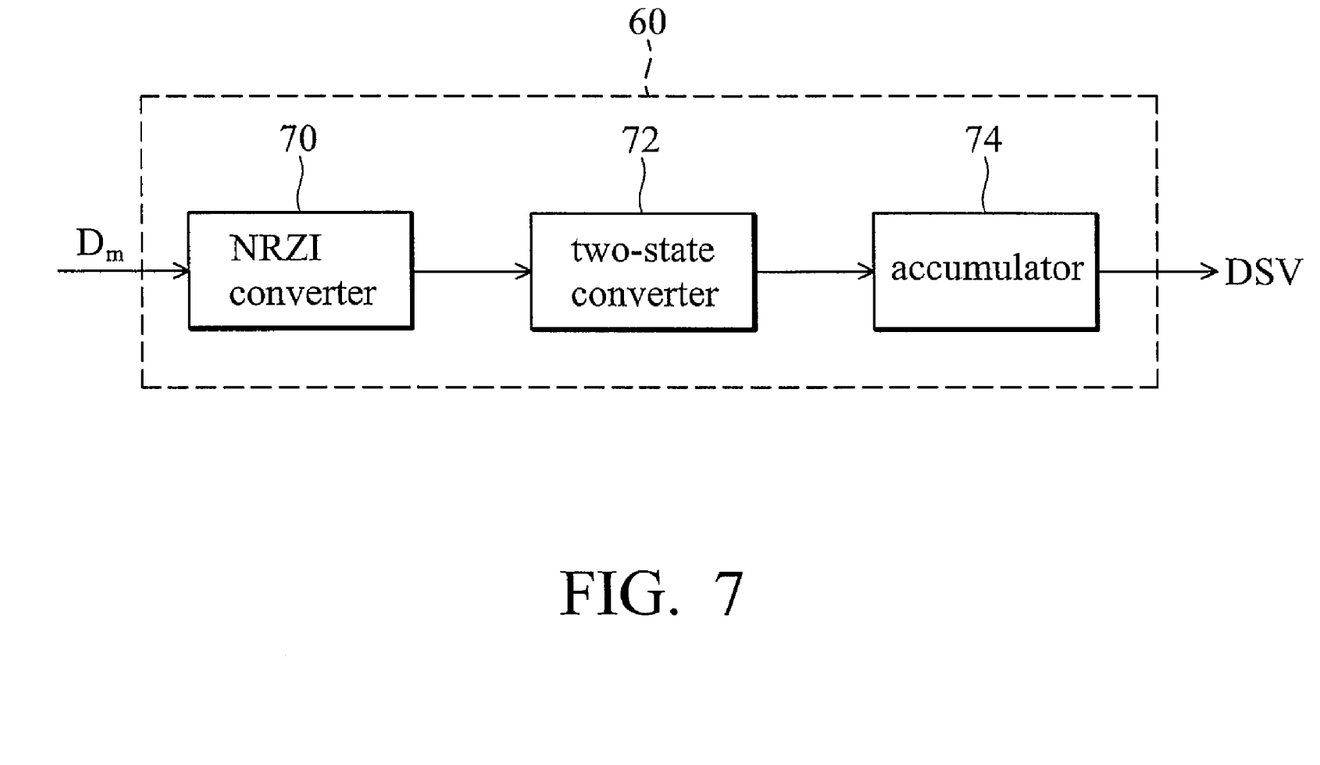
FIG. 7 is a block diagram of an exemplary DSV calculator in FIG. 6.

FIG. 7 is a block diagram of an exemplary DSV calculator in FIG. 5, comprising NRZI converter 70, two-state converter 72, and accumulator 74. NRZI converter 70 is coupled to two-state converter 72, and subsequently to accumulator 74. After NRZI converter 70 converts the modulated bit sequence into channel bit sequence Dc, two-state converter 72 assigns each binary bit ONE in the channel bit sequence with a state value of (+1), and each binary ZERO in the channel bit sequence with a state value of (−1). Accumulator 74 then sums the state values of every bit in the channel bit sequence to obtain digital sum value DSV, subsequently provided to DSV comparator 62.

Figure 8:
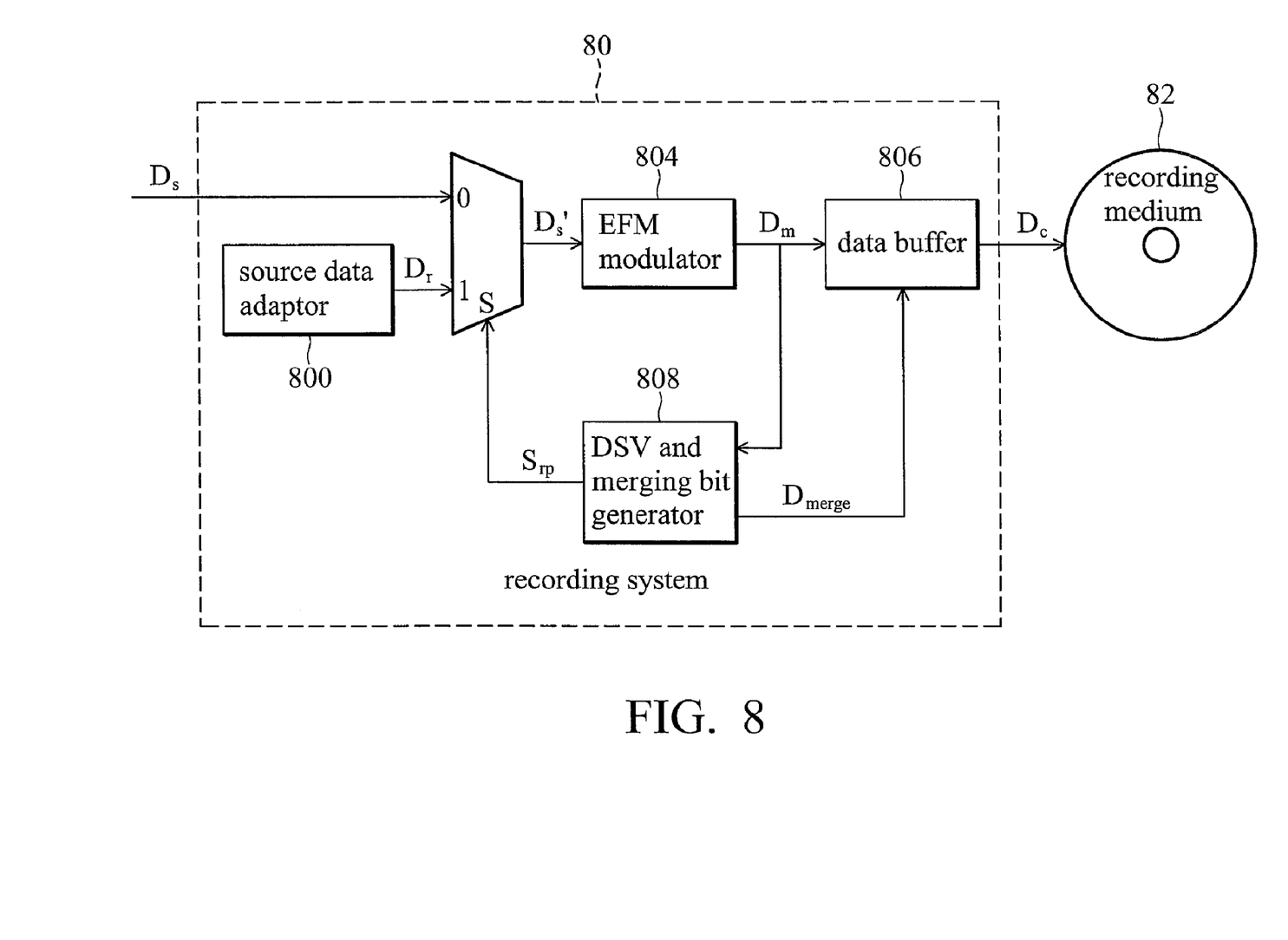
FIG. 8 is a block diagram of another exemplary recording system according to the invention.

FIG. 8 is a block diagram of another exemplary recording system according to the invention, comprising source data adaptor 800, multiplexer 802, EFM modulator 804, data buffer 806, and DSV and merging bit generator 808. Source data adaptor 800 is coupled to multiplexer 802, EFM modulator 804, subsequently to data buffer 806 and DSV and merging bit generator 808.

After encoding with Cross-Interleave Reed-Solomon (CIRC) encoder (not shown), multiplexer 802 receives source data Ds and source Replacement codeword Dr, and selects data Ds' therebetween based on adaptation signal $S_{adpt}$ from DSV and merging bit generator 808. EFM modulator 804 receives and encodes source data Ds' to channel bit $D_m$, subsequently passed to data buffer 806 for data storage and DSV and merging bits generator 808 for determining digital sum value DSV and merging bits $D_{merge}$. Merging bits $D_{merge}$ are inserted between channel bit $D_m$ and a synchronization pattern to form modulated bit sequence $D_m$ compliant with EFM modulation in FIG. 3. Merging bits generator 808 generates adaptation signal $S_{adpt}$ based on digital sum value DSV and merging bits $D_{merge}$ to select data $D_s'$ from source data $D_s$ and Replacement codeword $D_r$. Source data adaptor 26 provides replacement codeword $D_r$ so that after EFM modulation in EFM modulator 804 the digital sum value DSV of the modulated bit sequence is reduced. Replacement codeword $D_r$ is different from source data $D_s$, and selected such that source data $D_s$ can be recovered by performing error correction thereon.

DSV and merging bits generator 808 may be implemented according to FIGS. 5, 6, and 7. Replacement codeword $D_r$ may be predetermined fixed data or adaptive based on present channel bit $D_m$. Predetermined fixed data $D_{pred}$ may be a data byte in the source data format that results in channel bits '001xxxxxxxx100' after EFM modulation.

Figure 9:
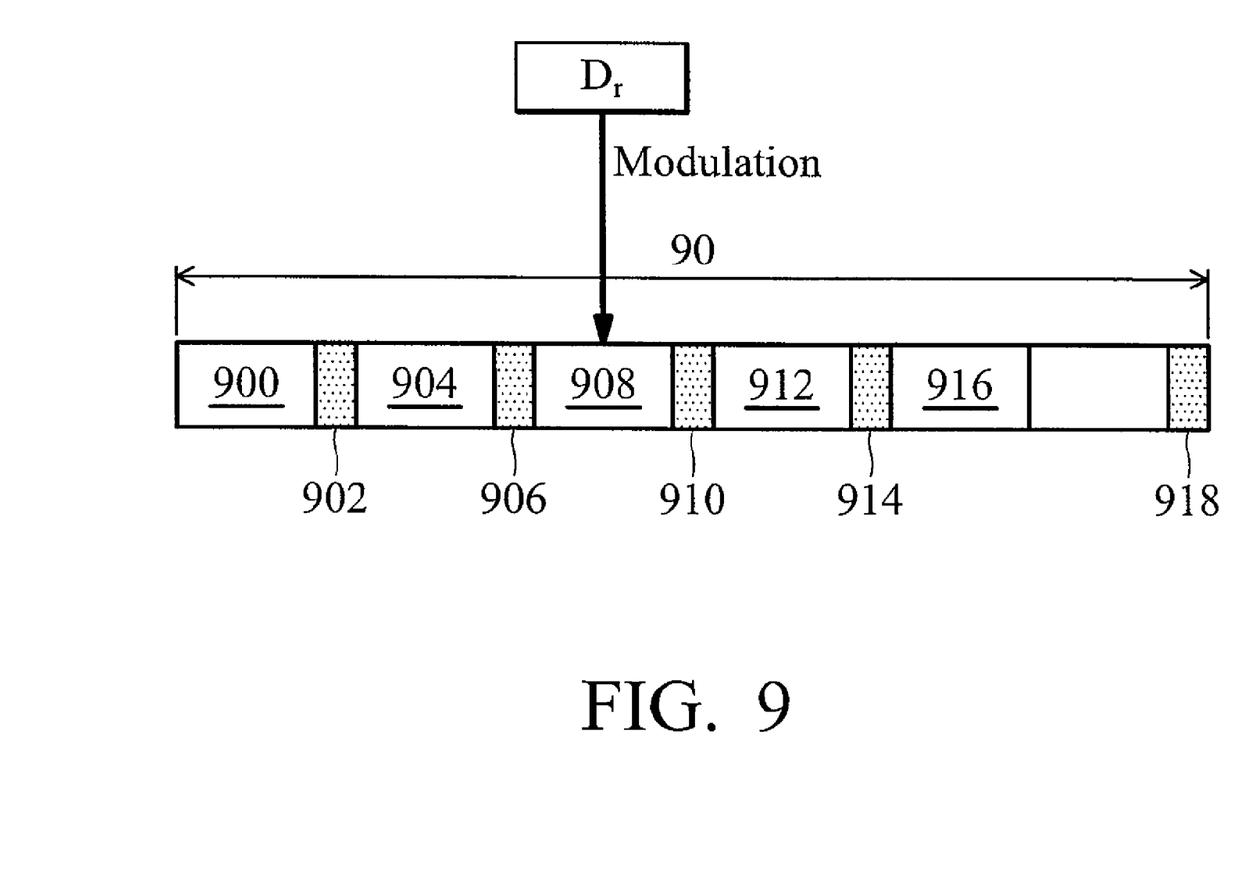
FIG. 9 shows an exemplary method of DSV protection in the invention.

FIG. 9 shows an exemplary method of DSV protection in the invention, incorporating the recording system in FIG. 8. Channel frame 90 comprises synchronization pattern 900, merging bits 902. codeword 904, merging bits 906. codeword 908, merging bits 910, codeword 912, merging bits 914, codeword 916, and merging bits 918.

Upon determination of performing DSV protection using source data replacement, source data $D_s$ corresponding to codeword 908 is replaced by Replacement codeword Dr, such that digital sum value DSV of the modulated sequence is reduced after the replacement.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of performing digital sum value (DSV) protection in an Eight-to-Fourteen/Eight-to-Fourteen Plus (EFM/EFM+) encoding system to generate a data frame to be recorded on a recording medium, comprising:
    modulating source data to the data frame having a predetermined number of channel bits;
    determining merging bits and DSV based on the channel bits; and
    changing the predetermined number of the channel bits in the data frame based on the DSV and the merging bits.

2. The method of claim 1, wherein changing comprises inserting or removing a channel bit at the end of the data frame.

3. The method of claim 1, wherein changing comprises changing the predetermined number of the channel bits if the DSV exceeds a threshold DSV.

4. The method of claim 1, wherein changing comprises changing the predetermined number of the channel bits if the determination of the merging bits has only one possibility based on the channel bits.

5. The method of claim 1, wherein the inserted channel bits are a codeword to be demodulated and discarded during decoding.

6. A method of performing digital sum value (DSV) protection in an Eight-to-Fourteen/Eight-to-Fourteen Plus (EFM/EFM+) encoding system, comprising:
    modulating source data to channel bits;
    determining first merging bits and DSV based on the channel bits; and
    changing the source data based on the DSV and the first merging bits, thereby determining second merging bits; and
    wherein the changed source data can be recovered via error correction code decoding.

7. The method of claim 6, wherein changing comprises replacing a codeword in the channel bits.

8. The method of claim 7, wherein the replacement codeword is adaptive based on the replaced codeword.

9. The method of claim 7, wherein the replacement codeword is a fixed codeword.

10. The method of claim 6, wherein changing comprises changing the source data if the DSV exceeds a threshold DSV.

11. The method of claim 6, wherein changing comprises changing the source data if the determination of the merging bits has only one possibility based on the channel bits.

12. An Eight-to-Fourteen/Eight-to-Fourteen Plus (EFM/EFM+) encoder, performing digital sum value (DSV) protection to generate a data frame to be recorded on a recording medium, comprising:
    a modulator, modulating source data to the data frame having a predetermined number of channel bits;
    a merging bits and DSV generator, coupled to the modulator, determining merging bits and DSV based on the channel bits; and
    a merging bit adaptor, coupled to the merging bits and DSV generator, changing the predetermined number of the channel bits in the data frame based on the DSV and the merging bits.

13. The EFM/EFM+ encoder of claim 12, wherein the merging bit adaptor inserts or removes a channel bit at the end of the data frame.

14. The EFM/EFM+ encoder of claim 12, wherein the merging bit adaptor changes the predetermined number of the channel bits if the DSV exceeds a threshold DSV.

15. The EFM/EFM+ encoder of claim 12, wherein the merging bit adaptor changes the predetermined number of the channel bits if the determination of the merging bits has only one possibility based on the channel bits.

16. The EFM/EFM+ encoder of claim 12, wherein the inserted channel bits are a codeword to be demodulated and discarded during decoding.

17. An Eight-to-Fourteen/Eight-to-Fourteen Plus (EFM/EFM+) encoder, performing digital sum value (DSV) protection, comprising:
   a modulator, modulating source data to channel bits;
   a merging bits and DSV generator, coupled to the modulator, determining first merging bits and DSV based on the channel bits; and
   a source data adaptor, coupled to the merging bits and DSV generator, changing the source data based on the DSV and the first merging bits, thereby determining second merging bits; and
   wherein the changed source data can be recovered via error correction code decoding.

18. The EFM/EFM+ encoder of claim 17, wherein the source data adaptor is a multiplexer selecting a replacement codeword to replace a codeword in the channel bits based on the DSV and the first merging bits.

19. The EFM/EFM+ encoder of claim 18, wherein the replacement codeword is adaptive based on the replaced codeword.

20. The EFM/EFM+ encoder of claim 18, wherein the replacement codeword is a fixed codeword.

21. The EFM/EFM+ encoder of claim 17, wherein the source data adaptor changes the source data if the DSV exceeds a threshold DSV.

22. The EFM/EFM+ encoder of claim 17, wherein the source data adaptor changes the source data if the determination of the merging bits has only one possibility based on the channel bits.

* * * * *